United States Patent
Cho et al.

(10) Patent No.: US 12,264,392 B2
(45) Date of Patent: Apr. 1, 2025

(54) SILICON PRECURSOR COMPOUNDS AND METHOD FOR FORMING SILICON-CONTAINING FILMS

(71) Applicant: ENTEGRIS, INC., Billerica, MA (US)

(72) Inventors: Sungsil Cho, Anyang-si (KR); DaHye Kim, Suwon-si (KR); SooJin Lee, Suwon-si (KR); Jae Eon Park, HwaSung (KR); Bryan C. Hendrix, Danbury, CT (US); Philip S. H. Chen, Bethel, CT (US); Shawn D. Nguyen, Danbury, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/356,252

(22) Filed: Jun. 23, 2021

(65) Prior Publication Data

US 2021/0395884 A1     Dec. 23, 2021

Related U.S. Application Data

(60) Provisional application No. 63/081,711, filed on Sep. 22, 2020, provisional application No. 63/042,769, filed on Jun. 23, 2020.

(51) Int. Cl.
| | |
|---|---|
| *C23C 16/00* | (2006.01) |
| *C23C 16/34* | (2006.01) |
| *C23C 16/36* | (2006.01) |
| *C23C 16/455* | (2006.01) |
| *C23C 16/52* | (2006.01) |

(52) U.S. Cl.
CPC ............ *C23C 16/345* (2013.01); *C23C 16/36* (2013.01); *C23C 16/45553* (2013.01); *C23C 16/52* (2013.01)

(58) Field of Classification Search
CPC .................................................... C23C 16/00
See application file for complete search history.

(56) References Cited

U.S. PATENT DOCUMENTS

| | | |
|---|---|---|
| 7,678,715 B2 | 3/2010 | Mungekar |
| 2015/0044881 A1 | 2/2015 | Shimamoto et al. |
| 2015/0118865 A1* | 4/2015 | Shimizu ............ C23C 16/45527 |
| | | 438/786 |
| 2017/0263439 A1 | 9/2017 | Hashimoto et al. |
| 2018/0023192 A1 | 1/2018 | Chandra |
| 2018/0033614 A1* | 2/2018 | Chandra ............... C23C 16/345 |
| 2020/0071819 A1 | 3/2020 | Lei et al. |
| 2020/0075312 A1 | 3/2020 | Chandra |

FOREIGN PATENT DOCUMENTS

| | | | | |
|---|---|---|---|---|
| CN | 104254442 A | 12/2014 | | |
| JP | 2016213217 A | 12/2016 | | |
| JP | 2019209573 A | 12/2019 | | |
| WO | 2014134476 A1 | 9/2014 | | |
| WO | 2017033979 A1 | 3/2017 | | |
| WO | 2020068770 A1 | 4/2020 | | |
| WO | WO-2020072625 A1 * | 4/2020 | ........... | C01B 33/126 |
| WO | WO-2020072874 A1 * | 4/2020 | | |

* cited by examiner

*Primary Examiner* — Kelly M Gambetta
*Assistant Examiner* — Mohammad Mayy

(57) ABSTRACT

Provided are certain silicon precursor compounds which are useful in the formation of silicon-containing films in the manufacture of semiconductor devices, and more specifically to compositions and methods for forming such silicon-containing films, such as films comprising silicon dioxide or silicon nitride.

11 Claims, 15 Drawing Sheets

SILICON PRECURSOR COMPOUNDS AND METHOD FOR FORMING SILICON-CONTAINING FILMS

CROSS-REFERENCE TO RELATED APPLICATIONS

This application claims the benefit under the provisions of 35 U.S.C. § 119 of U.S. Provisional Patent Application No. 63/042,769, filed Jun. 23, 2020, and U.S. Provisional Patent Application No. 63/081,711, filed Sep. 22, 2020, the entirety of which are incorporated herein by reference.

FIELD OF THE INVENTION

In general, the invention relates to methods and precursors for the deposition of silicon-containing films onto microelectronic device surfaces.

BACKGROUND OF THE INVENTION

In semiconductor manufacturing, thin (e.g., <1000 nanometers thickness) passive layers of chemically inert dielectric materials, such as silicon nitride ($Si_3N_4$), silicon oxynitride ($SiO_xN_y$), silicon carbide (SiC), silicon carbon nitride (SiCN) and silicon carbo oxide (SiCO) and/or silicon dioxide ($SiO_2$) are widely employed in microelectronic device structures, to function as structural elements of the multi-layered device such as sidewall spacer elements, diffusion masks, oxidation barriers, trench isolation coatings, intermetallic dielectric materials, passivation layers, insulators and etch-stop layers.

Deposition of silicon-containing films by chemical vapor deposition techniques is a highly attractive methodology for forming such films. CVD processes involving low deposition temperatures are particularly desired, e.g., temperatures less than about 450° C., but require the availability of suitable silicon precursor compounds for such purpose. In some cases, higher deposition temperatures can be considered, when the thermal budget of the integrated circuit will allow. In these cases, temperatures >450° C. might be utilized to achieve the desired dielectric film. Accordingly, a need exists for precursors for the formation of silicon-containing films which can be utilized at such higher temperatures. In particular, there is a need for liquid silicon precursors with good thermal stability, high volatility, and reactivity with a substrate surface.

SUMMARY OF THE INVENTION

The invention relates generally to the formation of silicon-containing films in the manufacture of semiconductor devices, and more specifically to compositions and methods for forming such silicon-containing films. In one particular embodiment, the precursor bis(trichlorosilyl)ethane was found useful in forming silicon dioxide and silicon nitride films of high purity and at a high growth rate, i.e., about 1.5 Å/cycle at 600° C. using ozone as oxidizing gas and about 1.47 Å/cycle at 725° C. using ammonia. Moreover, as shown by the data provided herein, the wet etch rate (WER) of the films resulting from this precursor were significantly improved over the resulting silicon dioxide film formed utilizing bis(tertiary-butylamino) silane (BTBAS) with ozone and silicon nitride films formed with hexachlorodisilane (HCDS). Bis(trichlorosilyl)ethane was found to be thermally stable at temperatures above 600° C., thus rendering it useful in relatively high temperature atomic layer deposition processes where high purity silicon dioxide films are desired.

DETAILED DESCRIPTION OF THE INVENTION

Figure 1:
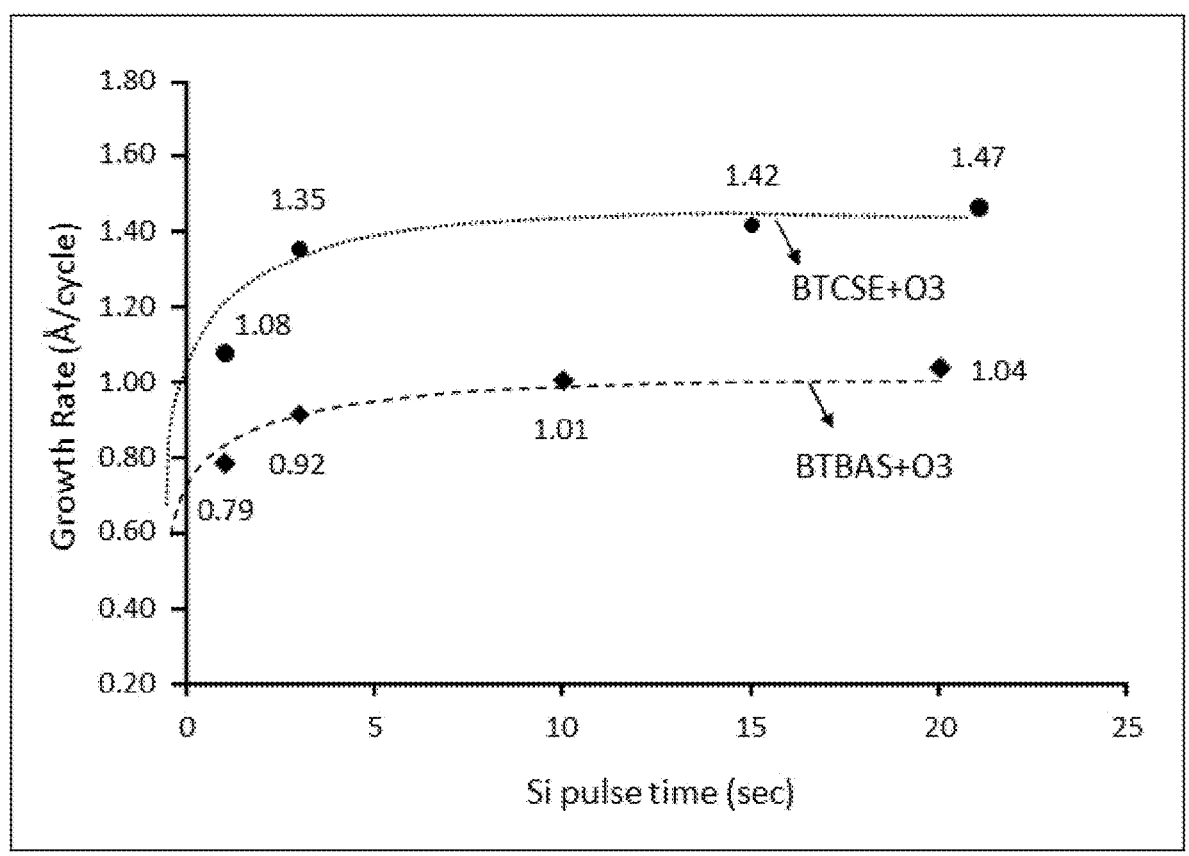
FIG. 1 is a graph of growth rate (A/cycle) versus precursor pulse time in seconds. This figure compares the known silicon precursor BTBAS (bis(tertiary-butylamino)silane), utilizing ozone as an oxidizing gas, with an exemplary compound of Formula (I) of the present invention, i.e., BTCSE, utilizing ozone as an oxidizing gas.
Figure 2:
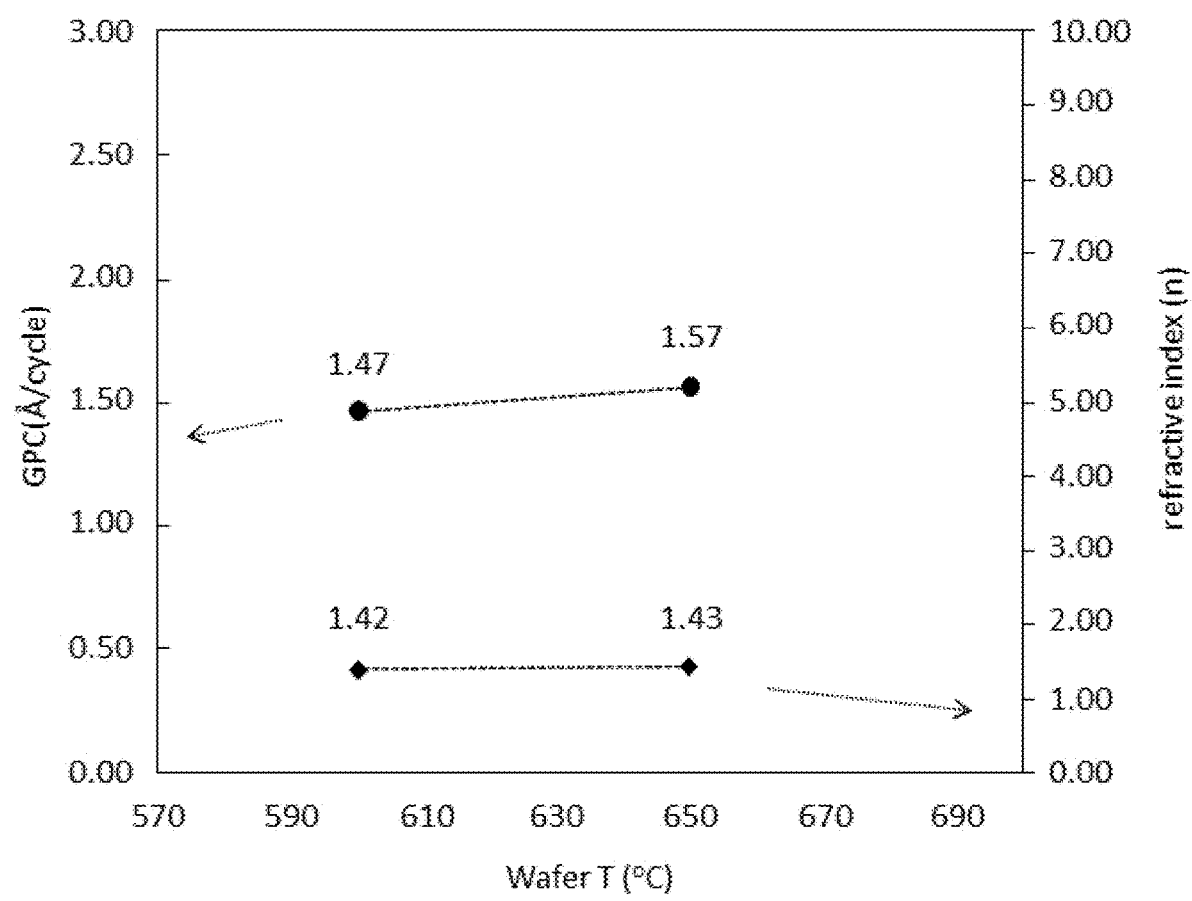
FIG. 2 illustrates the growth rate/cycle for an ALD silicon dioxide deposition process while varying the substrate temperature from 600° C. to 650° C. The circle points represent the saturation curve and the diamond points represent the refractive index. In this experiment, a flow rate of 1000 sccm of $O_3$ was utilized. The pulsed deposition cycle sequence utilized was (i) precursor for 21 seconds, (ii) purge for 20 seconds, (iii) ozone for 30 seconds, and (iv) purge for 20 seconds.

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g. 1 to 5 includes 1, 1.5, 2, 2.75, 3, 3.80, 4 and 5).

In a first aspect, the invention provides compounds of Formula (I):

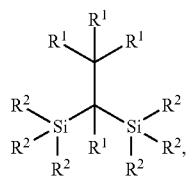

(I)

wherein each $R^1$ is independently chosen from hydrogen or $C_1$-$C_4$ alkyl, and each $R^2$ is independently chosen from chloro, bromo, iodo, hydrogen, or $C_1$-$C_4$ alkyl, provided that no fewer than two of $R^2$ is chosen from chloro, bromo, or iodo. In one embodiment, each $R^1$ is hydrogen. In another embodiment, each $R^2$ is chosen from chloro, bromo, or iodo. In another embodiment, each $R^1$ is hydrogen and each $R^2$ is chloro, i.e., a compound of the formula

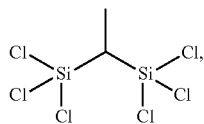

referred to herein by the acronym "BTCSE".

The compounds of Formula (I) are useful as precursors in the vapor deposition of silicon-containing films and, in particular, films on the surface(s) of microelectronic devices. In certain embodiments, the films also contain nitrogen and/or oxygen and/or carbon. Accordingly, in a second aspect, the invention provides a method for forming a silicon-containing film onto the surface of a microelectronic device, which comprises introducing at least one compound of Formula (I) to said surface in a reaction chamber, under vapor deposition conditions.

As used herein, the term "silicon-containing film" refers to films such as silicon dioxide, silicon nitride, silicon oxynitride, silicon carbide, silicon carbonitride, silicon oxy-carbonitride, low-k thin silicon-containing films, high-k gate silicate films and low temperature silicon epitaxial films.

In certain embodiments, vapor deposition conditions comprise reaction conditions known as chemical vapor deposition, pulsed-chemical vapor deposition, and atomic layer deposition. Preferably, the vapor deposition conditions do not utilize plasma. In the case of pulsed-chemical vapor deposition, a series of alternating pulses of precursor compounds and co-reactant(s), either with or without an intermediate (inert gas) purge step, can be utilized to build up the film thickness to a desired endpoint.

In certain embodiments, the pulse time (i.e., duration of precursor exposure to the substrate) for the precursor compounds depicted above ranges between about 1 and 30 seconds. When a purge step is utilized, the duration is from about 1 to 20 seconds or 1 to 30 seconds. In other embodiments, the pulse time for the co-reactant ranges from 5 to 60 seconds.

In one embodiment, the vapor deposition conditions comprise a temperature of about 100° C. to about 1000° C., such as about 450° C. to about 1000° C., about 400° C. to about 600° C., or greater than 600° C. to about 900° C., and a pressure of about 0.5 to about 1000 Torr. In another embodiment, the vapor deposition conditions comprise a temperature of about 100° C. to about 800° C., such as about, about 425° C. to about 525° C., 500° C. to about 750° C., or about 625° C. to about 725° C.

The compounds above can be employed for forming high-purity thin silicon-containing films by any suitable vapor deposition technique, such as CVD, digital (pulsed) CVD, ALD, and pulsed plasma processes. Such vapor deposition processes can be utilized to form silicon-containing films on microelectronic devices, the films having a thickness of from about 20 angstroms to about 2000 angstroms, such as about 20 angstroms to about 1000 angstroms or about 100 angstroms to about 1000 angstroms. For example, the silicon-containing films have a thickness of from about 100 angstroms to about 250 angstroms or about 200 angstroms to about 500 angstroms.

In the process of the invention, the compounds above may be reacted with the desired microelectronic device substrate in any suitable manner, for example, in a single wafer CVD, ALD and/or PECVD or PEALD chamber, or in a furnace containing multiple wafers.

Alternatively, the process of the invention can be conducted as an ALD or ALD-like process. As used herein, the terms "ALD or ALD-like" refer to processes such as (i) each reactant including the silicon precursor compound of Formula (I) and an oxidizing and/or reducing co-reactant gas is introduced sequentially into a reactor such as a single wafer ALD reactor, semi-batch ALD reactor, or batch furnace ALD reactor, or (ii) each reactant, including the silicon precursor compound of Formula (I) and an oxidizing and/or reducing co-reactant gas is exposed to the substrate or microelectronic device surface by moving or rotating the substrate to different sections of the reactor and each section is separated by an inert gas curtain, i.e., spatial ALD reactor or roll to roll ALD reactor.

In general, the desired film produced using the precursor compounds of Formula (I) can be tailored by choice of each compound, coupled with the utilization of reducing or oxidizing co-reactants. See, for example, the following Scheme 1 which illustrates how the precursors of Formula (I) may be utilized in vapor deposition processes:

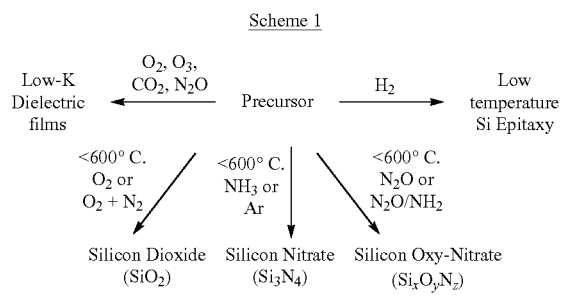

Scheme 1

In one embodiment, the vapor deposition processes may further comprise a step involving exposing the precursor to a co-reactant gas such as $H_2$, $H_2$ plasma, $H_2/O_2$ mixtures, water, $N_2O$, $N_2O$ plasma, $NH_3$, $NH_3$ plasma, $N_2$, or $N_2$ plasma. For example, an oxidizing co-reactant gas such as $O_2$, $O_3$, $N_2O$, water vapor, alcohols or oxygen plasma may be used. In one embodiment, the precursor BTCSE is utilized in an ALD process with $O_3$ as the oxidizing co-reactant gas. In certain embodiments, the gas further comprises an inert gas such as argon, helium, nitrogen, or a combination thereof. In another embodiment, the gas further comprises nitrogen, which can react with the precursors of Formula (I) under plasma conditions to form silicon oxynitride films. In one embodiment, the invention relates to a high temperature thermal atomic layer deposition (ALD) process for depositing low wet etching rate silicon dioxide films using ozone as an oxidizing co-reactant gas.

In another embodiment, the vapor deposition processes above may further comprise a step involving exposing the film to a co-reactant gas comprised of gases chosen from $H_2$, hydrazine ($N_2H_4$), methyl hydrazine, t-butyl hydrazine, 1,1-dimethylhydrazine, 1,2-dimethylhydrazine, and $NH_3$. For example, ammonia gas may be used in a non-plasma deposition process for forming silicon nitride. In certain embodiments, the gas further comprises an inert gas such as argon, helium, nitrogen, or a combination thereof.

Figure 3:
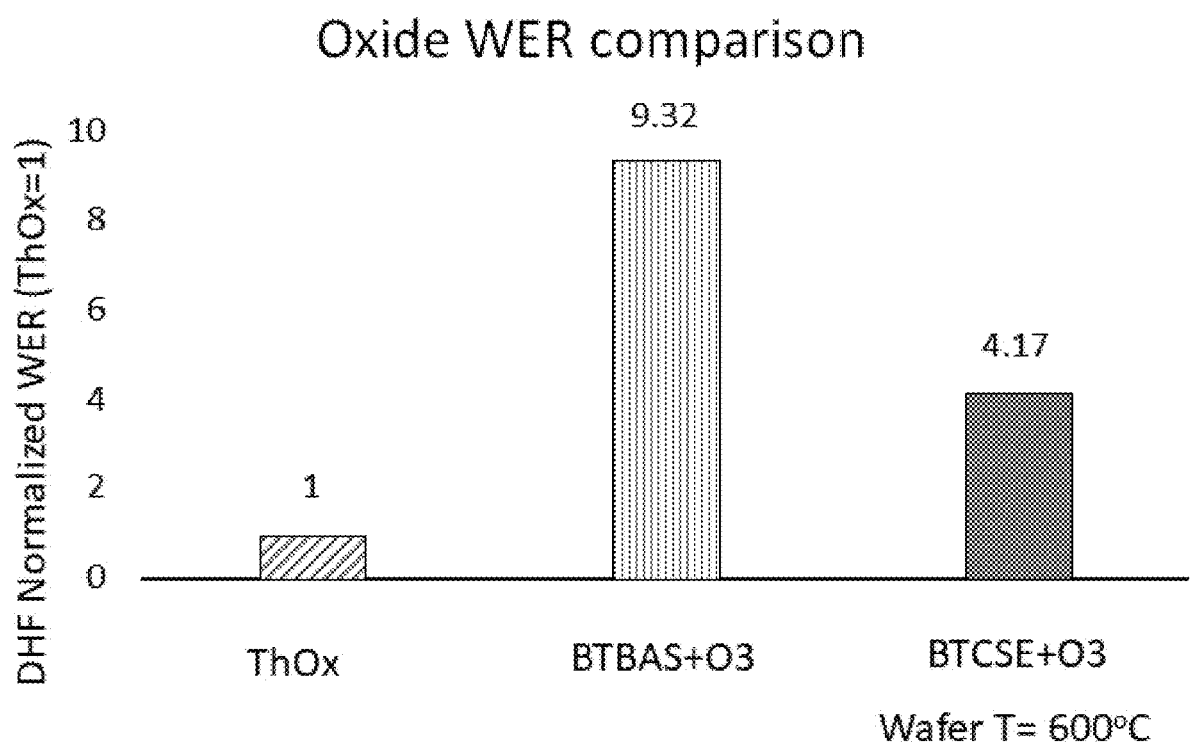
FIG. 3 is a wet etch rate comparison (200:1 dilute HF) using thermal oxide as a normalized benchmark=1. This graph illustrates greatly improved wet etch performance of an exemplary compound of Formula (I) of the present invention, i.e., BTCSE, over the known silicon precursor, BTBAS (bis(tertiary-butylamino)silane).
Figure 4:
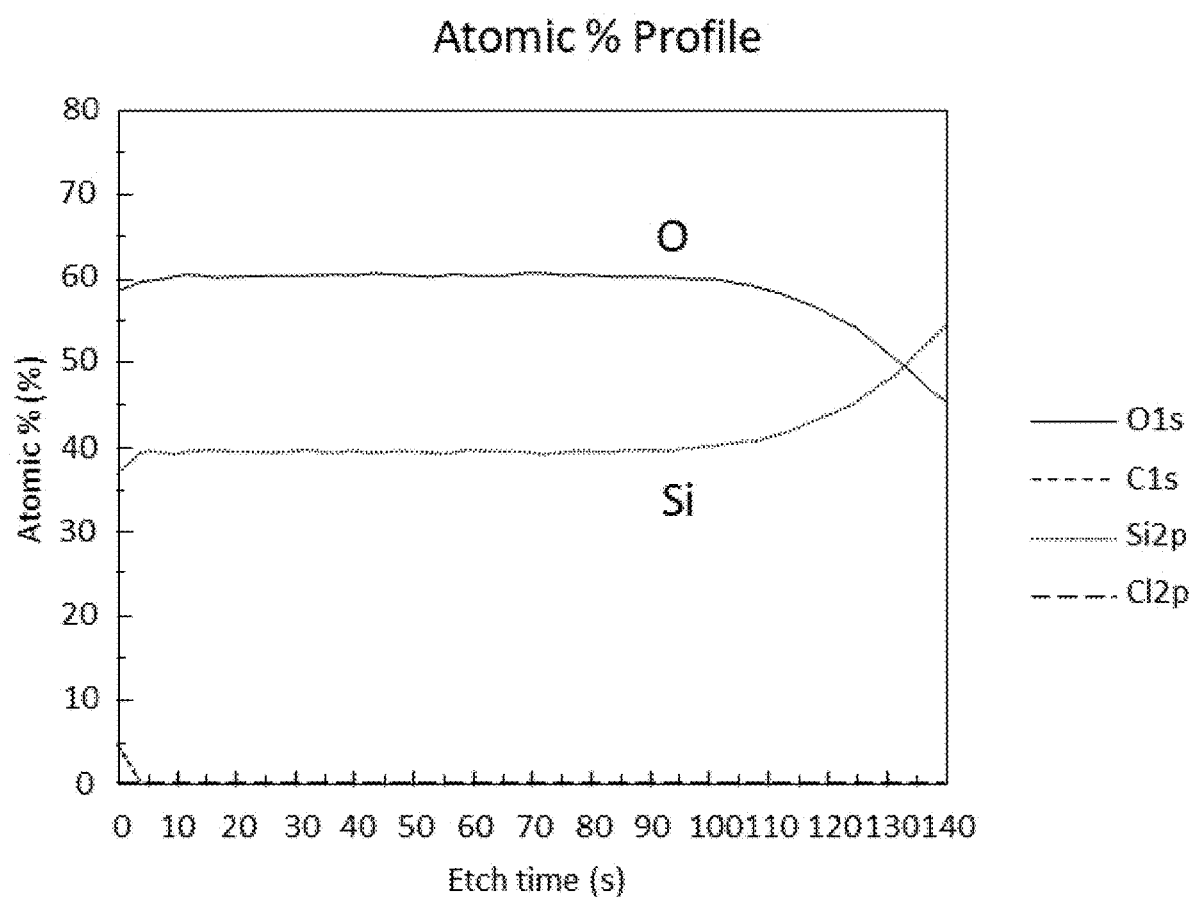
FIG. 4 is an atomic percentage profile of an $SiO_2$ film formed utilizing BTCSE and ozone. This data illustrates that there is no measurable quantity of carbon or chlorine in the $SiO_2$ film.
Figure 5:
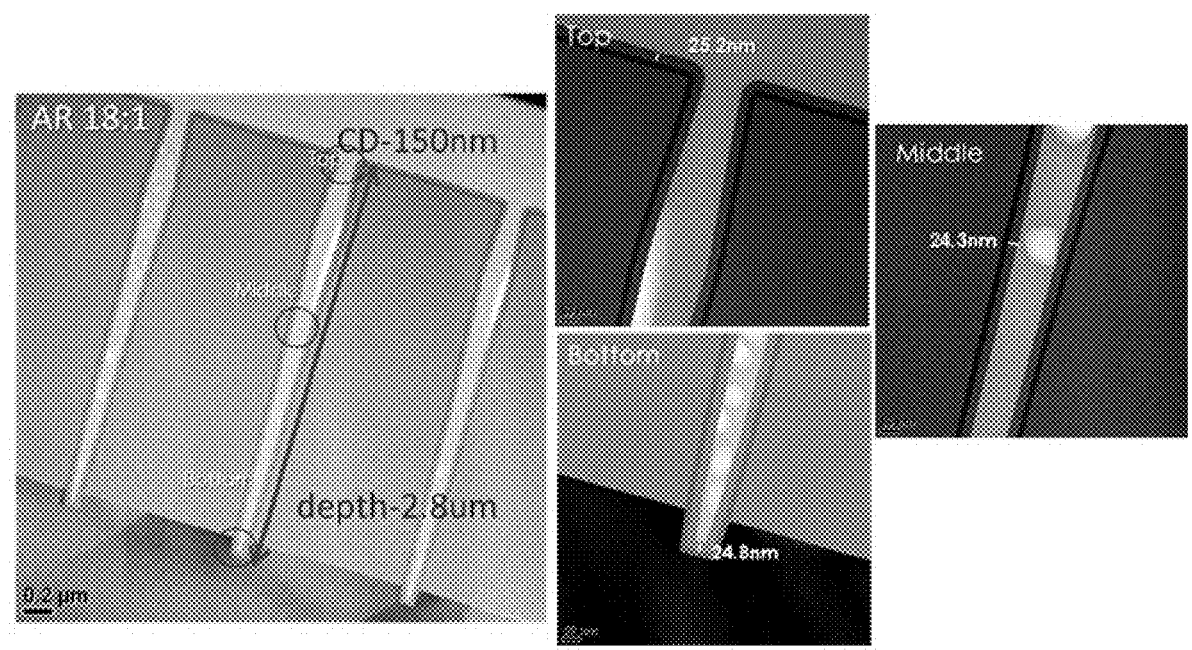
FIG. 5 is a TEM (transmission electron micrograph) of an illustrative microelectronic device structure illustrating superior $SiO_2$ film formation in a high aspect ratio structure exhibiting greater than 96% step coverage.

In a preferred embodiment, the invention relates to a high temperature (such as greater than 400° C. or greater than 600° C.) thermal atomic layer deposition (ALD) process for depositing low wet etching rate silicon nitride films using ammonia as a reducing co-reactant gas. A plasma assisted or enhanced ALD process typically provides films, such as silicon nitride films, have lower conformality and lower uniformity in film thickness. Thermal ALD is therefore preferable, assuming the deposition precursor is stable at the elevated temperatures. The compounds of Formula (I) have been found to be capable of both low-temperature PECVD and/or PEALD formation of silicon-containing films as well as high temperature non-plasma ALD. Such compounds exhibit high volatility and chemical reactivity but are stable with respect to thermal degradation at temperatures involved in the volatilization or vaporization of the precursor, allowing consistent and repeatable transport of the resulting precursor vapor to the deposition zone or reaction chamber. In this regard, it has been found that surprisingly BTCSE is stable at temperatures in excess of 600° C. and further that BTCSE does not exhibit thermal degradation until about 650° C. The chemical reactivity of the compounds of Formula (I) allows for film growth utilizing PEALD techniques at low temperatures at which traditional silicon precursor materials such as TEOS are inert and thus, exhibit little or no deposition behavior. Additionally, as noted above, FIG. 3 graphically illustrates greatly improved wet etch performance of an exemplary compound of Formula (I) of the present invention, (i.e., BTCSE) over the performance of the known silicon precursor BTBAS (bis(tertiary-butylamino)silane). Accordingly, in a further embodiment, the invention provides the method of the invention as set forth above, wherein the silicon-containing film is silicon dioxide, and wherein the silicon dioxide film thus formed exhibits a wet etch rate which is at least about 50% improved compared to that of $SiO_2$ deposited with BTBAS and ozone.

Figure 6:
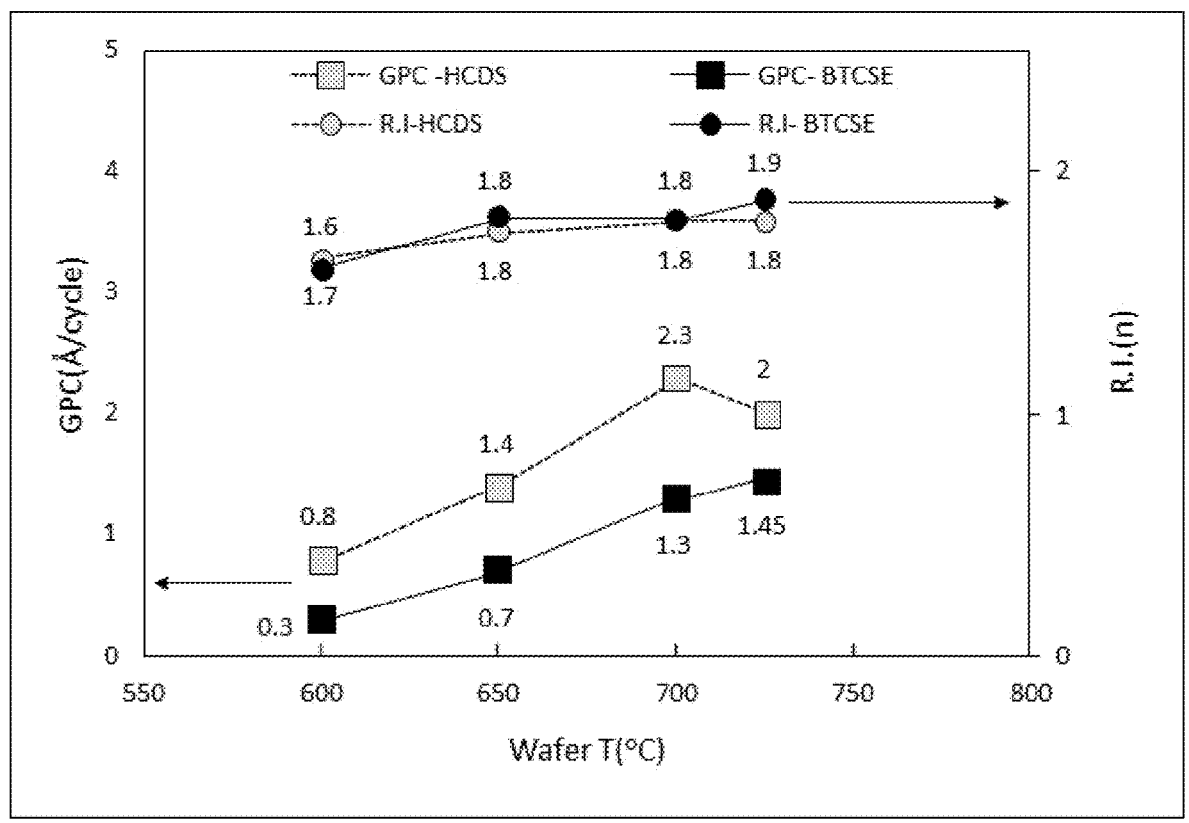
FIG. 6 illustrates the growth rate/cycle for a thermal ALD silicon nitride deposition process while varying the substrate temperature from 600° C. to 725° C. The square points represent the saturation curve and the circle points represent the refractive index. In this experiment, a flow rate of 300 sccm of $NH_3$ was utilized. The pulsed deposition cycle sequence utilized was (i) precursor for 21 seconds, (ii) purge for 20 seconds, (iii) ammonia for 25 seconds, and (iv) purge for 20 seconds.
Figure 7:
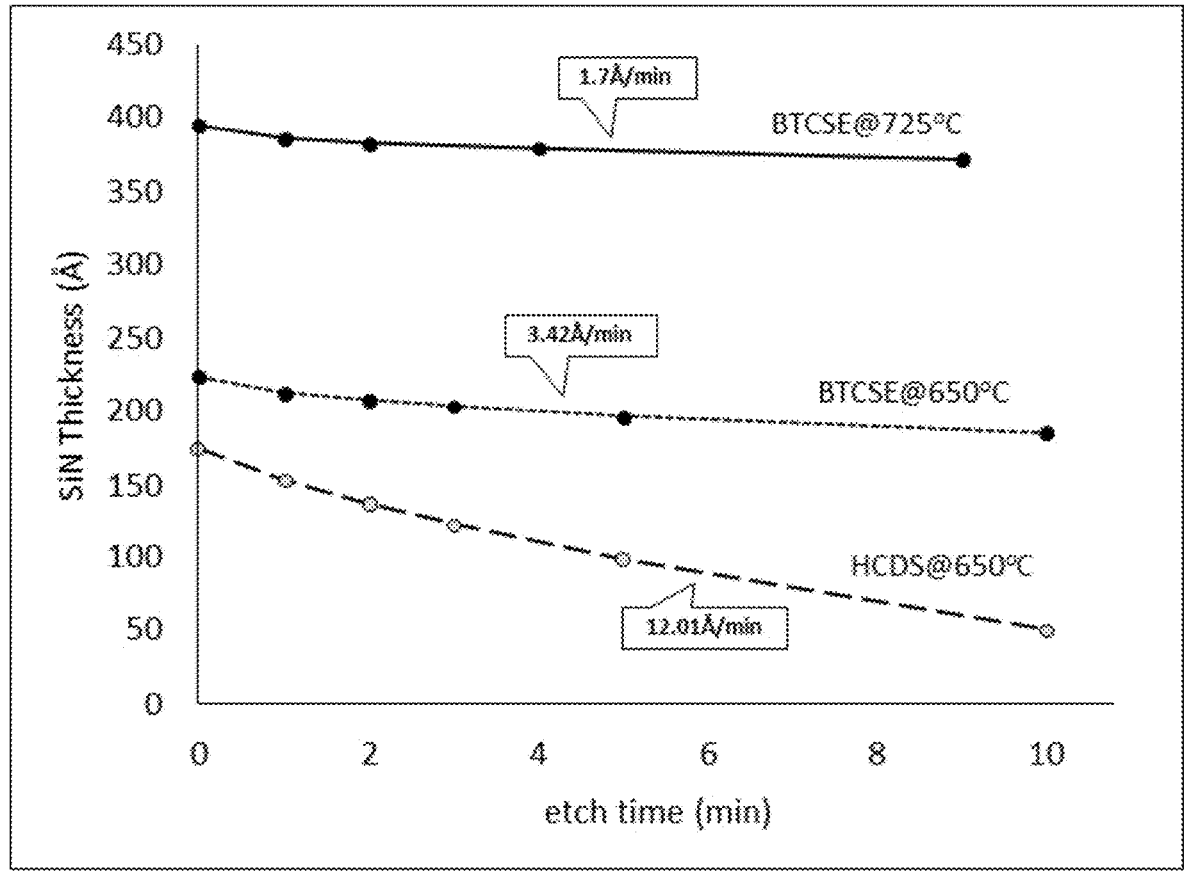
FIG. 7 is a wet etch rate comparison (100:1 dilute HF). This graph illustrates greatly improved wet etch performance of silicon nitride prepared using an exemplary compound of Formula (I) of the present invention, i.e., BTCSE, compared to silicon nitride formed using a known silicon precursor, HCDS (hexachlorodisilane) at comparable thickness. Silicon nitride prepared by CVD, as a reference, had an etch rate of 3.3 Å/min under the same conditions.
Figure 8A:
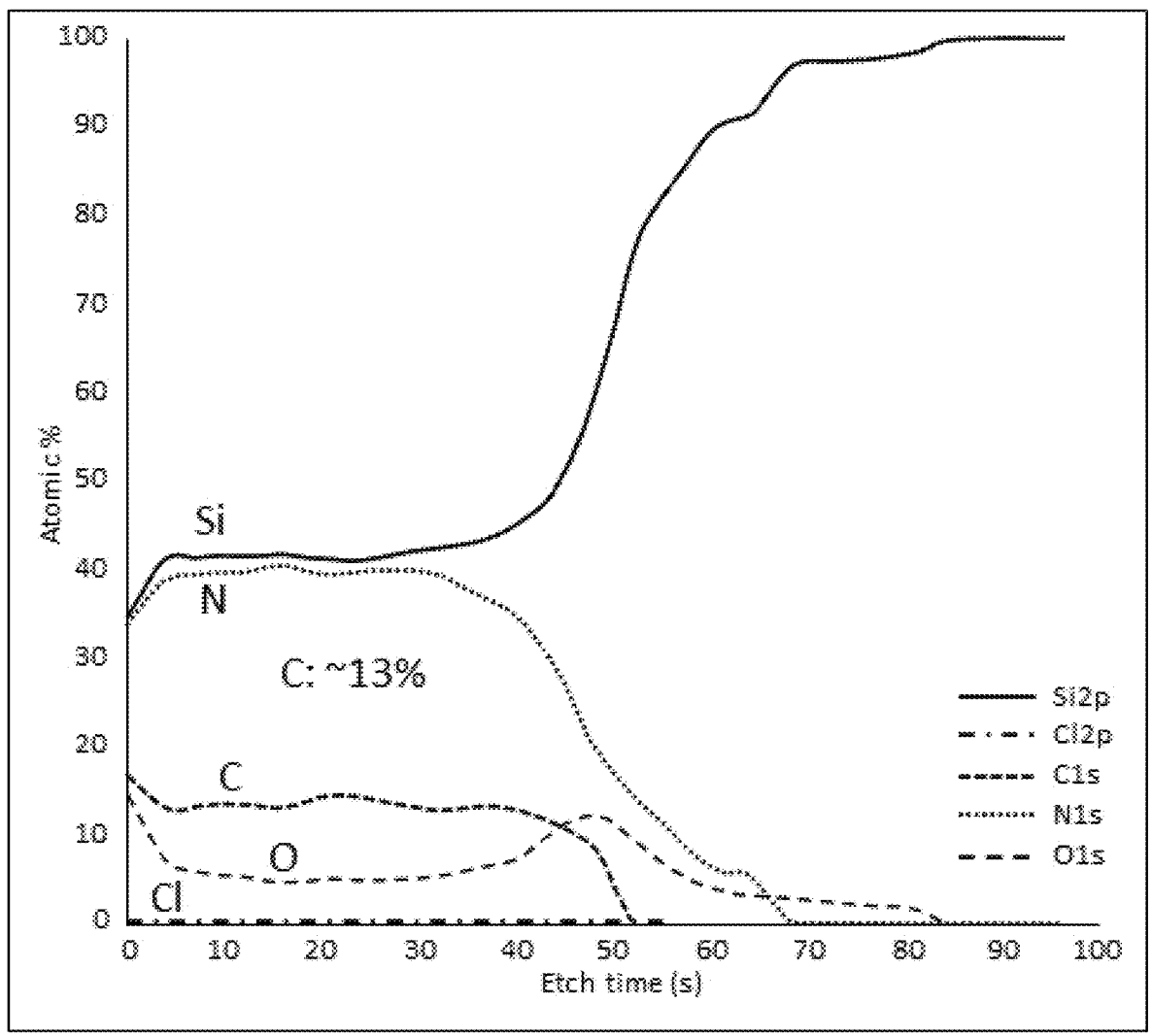
FIGS. 8A and 8B are atomic percentage profile of a silicon nitride film formed by a thermal deposition (non-plasma) process utilizing BTCSE and ammonia at 650° C. and 725° C. This data illustrates that there is no measurable quantity of chlorine and very low levels of carbon in the silicon nitride film, with less carbon found at the higher temperature. This demonstrates that BTCSE may be used in a high temperature (greater than 600° C.) non-plasma deposition process to produce high purity silicon nitride with surprisingly high etch resistance even at very low thicknesses.
Figure 8B:
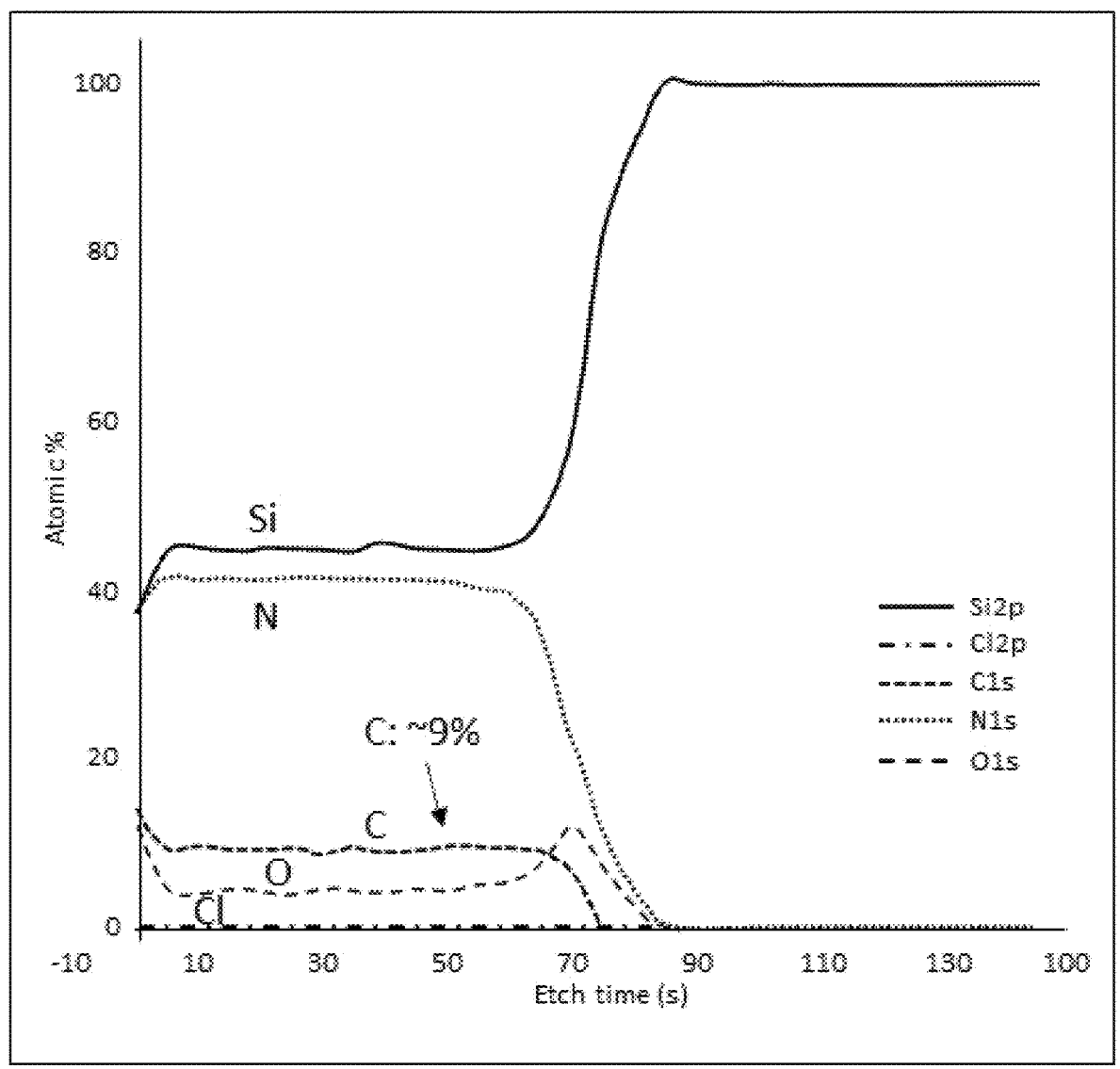

Furthermore, the chemical reactivity of the compounds of Formula (I) has also been found to allow for film growth utilizing thermal ALD techniques at high temperatures at which traditional silicon precursor typically are not suitable. As noted above, FIG. 6 graphically illustrates greatly improved wet etch performance of an exemplary compound of Formula (I) of the present invention, (i.e., BTCSE) over the performance of the known silicon precursor HCDS (hexachlorodisilane) for forming silicon nitride. Accordingly, in a further embodiment, the invention provides the method of the invention as set forth above, wherein the silicon-containing film is silicon nitride, and wherein the silicon nitride film thus formed exhibits a wet etch rate which is at least about 50% improved compared to that of silicon nitride deposited with HCDS and ammonia. For example, the silicon nitride film may have a wet etch rate of less than 3.50 Å/min, such as less than 2.00 Å/min, at a film thickness of less than about 400 Å, such as less than about 250 Å.

While using the precursor compounds of Formula (I), the incorporation of carbon and nitrogen into such films may be accomplished by utilization of co-reactants such as carbon in the form of methane, ethane, ethylene or acetylene for example, to further introduce carbon content into the silicon-containing films, thereby producing silicon carbide. Similarly, nitrogen may be introduced by utilization of nitrogen-containing reducing gases.

The deposition methods disclosed herein may involve one or more purge gases. The purge gas, which is used to purge away unconsumed reactants and/or reaction by-products, is an inert gas that does not react with the precursors. Exemplary purge gases include, but are not limited to, argon, nitrogen, helium, neon, hydrogen, and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

The respective step of supplying the silicon precursor compounds, co-reactant gases such as an oxidizing gas or reducing gas, and/or other precursors, source gases, and/or reagents may be performed by changing the sequences for supplying them and/or changing the stoichiometric composition of the resulting dielectric film.

Energy is applied to the at least one of the silicon precursor compounds of Formula (I) and co-reactant oxidizing gas, reducing gas, or combination thereof to induce reaction and to form the silicon-containing film on the microelectronic device substrate. Such energy can be provided by, but not limited to, thermal, pulsed thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively, a remote plasma-generated process in which plasma is generated 'remotely' of the reaction zone and substrate, being supplied into the reactor.

As used herein, the term "microelectronic device" corresponds to semiconductor substrates, including 3D NAND structures, flat panel displays, and microelectromechanical systems (MEMS), manufactured for use in microelectronic, integrated circuit, or computer chip applications. It is to be understood that the term "microelectronic device" is not meant to be limiting in any way and includes any substrate that includes a negative channel metal oxide semiconductor (nMOS) and/or a positive channel metal oxide semiconductor (pMOS) transistor and will eventually become a microelectronic device or microelectronic assembly. Such microelectronic devices contain at least one substrate, which can be chosen from, for example, silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, germanium, germanium-containing, boron-containing, Ga/As, a flexible substrate, porous inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

The compounds of Formula (I) can be prepared by reacting a substituted vinyl silane with a silane in the presence of tetrakis(triphenylphosphine)palladium(0). By way of example, Scheme 2 below illustrates the synthesis of a compound of Formula (I) wherein each $R^1$ is hydrogen and each $R^2$ is chloro:

Scheme 2

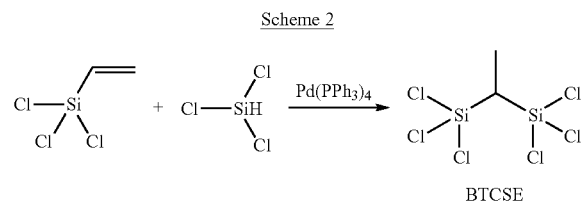

BTCSE

This invention can be further illustrated by the following examples of preferred embodiments thereof, although it will be understood that these examples are included merely for purposes of illustration and are not intended to limit the scope of the invention unless otherwise specifically indicated.

Example 1—Synthesis of BTCSE

Trichlorovinylsilane (500.0 g, 3.1 mole), trichlorosilane (419.4 g, 3.1 mole), and tetrkis(triphenylphosine)palladium (0) (1.8 g) were placed into a 1 L 3-neck round bottom flask. The reaction mixture was heated at 192° C. After temperature was arrived at 192° C., the reaction mixture was cool down at 80° C. The product was purified by a simple distillation at 80° C. under 20 torr to yield the final product as a colorless liquid (825 g, 89.7%). The product was found to be greater than 98% pure.

Example 2—Vapor Deposition Using BTCSE with Ozone as a Co-Reactant Gas

A silicon oxide film was deposited with bis(trichlorosilyl)ethane which was placed in a bubbler at 40° C. Double shower head ALD reactor was used to deposit the silicon oxide film on a silicon wafer with ozone reactant from 450° C. to 650° C. as the wafer temperature, and the reactor pressure was controlled at 0.5 to 1.5 Torr. A silicon oxide deposition was followed by 21 second silicon pulse, 20 second Ar purge, 30 second ozone pulse and 20 second Ar purge; and this cycle was repeated for 190 cycles to give a film thickness of 300 Å. It was saturated about 1.57/cycle at 650° C. without carbon and chlorine impurities in the film. The film wet etch rate was obtained 62 Å/min using 0.2% HF diluted solution.

Example 3—Vapor Deposition Using BTCSE with Ammonia as a Co-Reactant Gas

A silicon nitride film was deposited with bis(trichlorosilyl)ethane which was placed in a bubbler at 40° C. Double shower head ALD reactor was used to deposit the silicon nitride film on a silicon wafer with ammonia reactant from 600° C. to 725° C. as the wafer temperature, and the reactor pressure was controlled at 0.5 to 1.5 Torr. A silicon nitride deposition was followed by 21 second silicon pulse, 20 second Ar purge, 25 second ammonia pulse and 20 second Ar purge; and this cycle was repeated for 190 cycles to give a film thickness of 400 Å. It was saturated about 1.45/cycle at 725° C. with less than 10% carbon and without chlorine impurities in the film. The film wet etch rate obtained was 1.7 Å/min using 0.1% HF diluted solution.

Example 4—Vapor Deposition Using BTCSE with Ammonia as a Co-Reactant Gas

Figure 9:
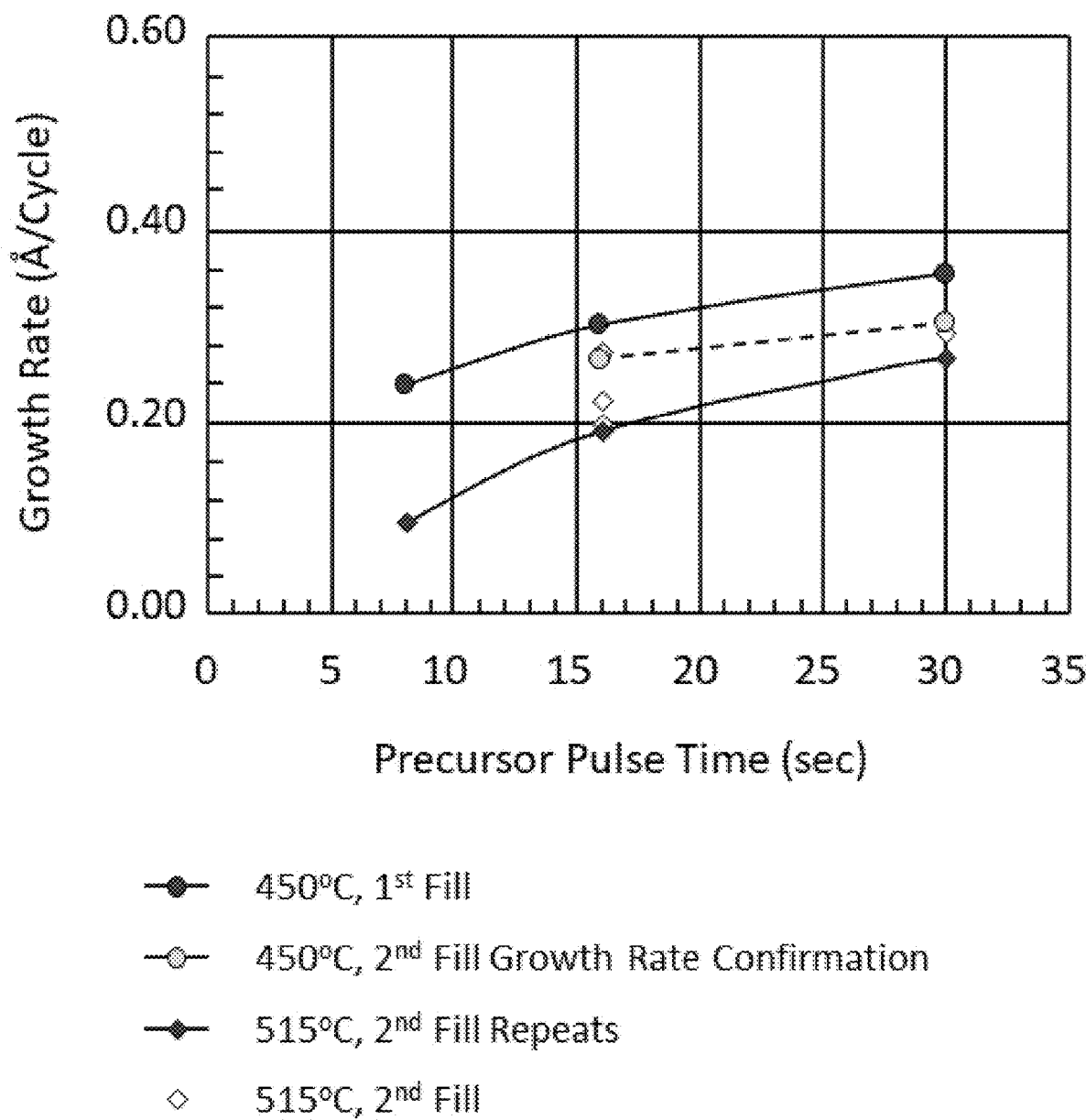
FIG. 9 illustrates the growth rate/cycle for a thermal (non-plasma) ALD silicon deposition process using BTSCE with ammonia as the co-reactant at substrate temperatures of 450° C. and 515° C.
Figure 10A:
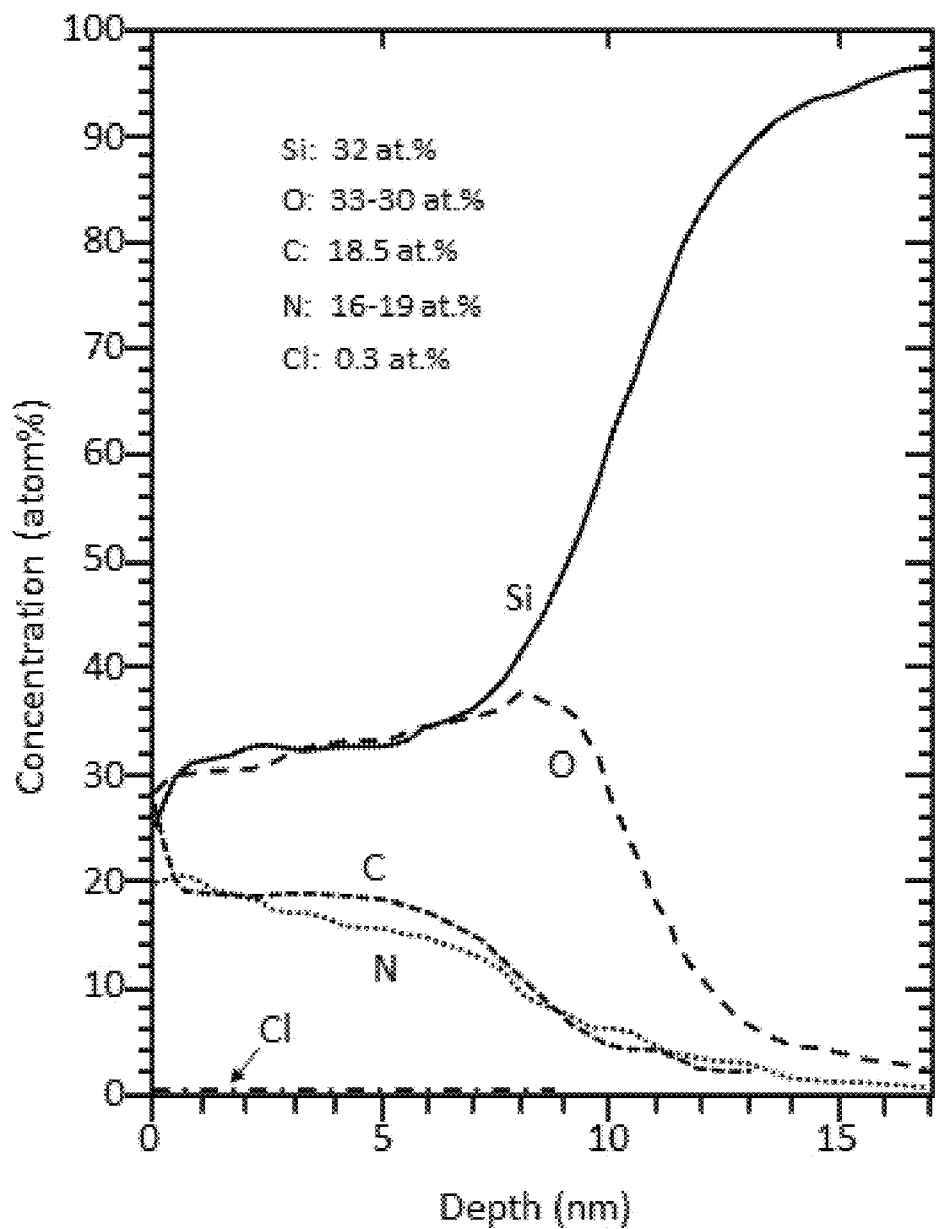
FIGS. 10A and 10B are atomic percentage profile of the resulting silicon-containing film, and FIG. 11 demonstrates the extremely high conformality of these films when deposited onto a high aspect ratio structure.
Figure 10B:
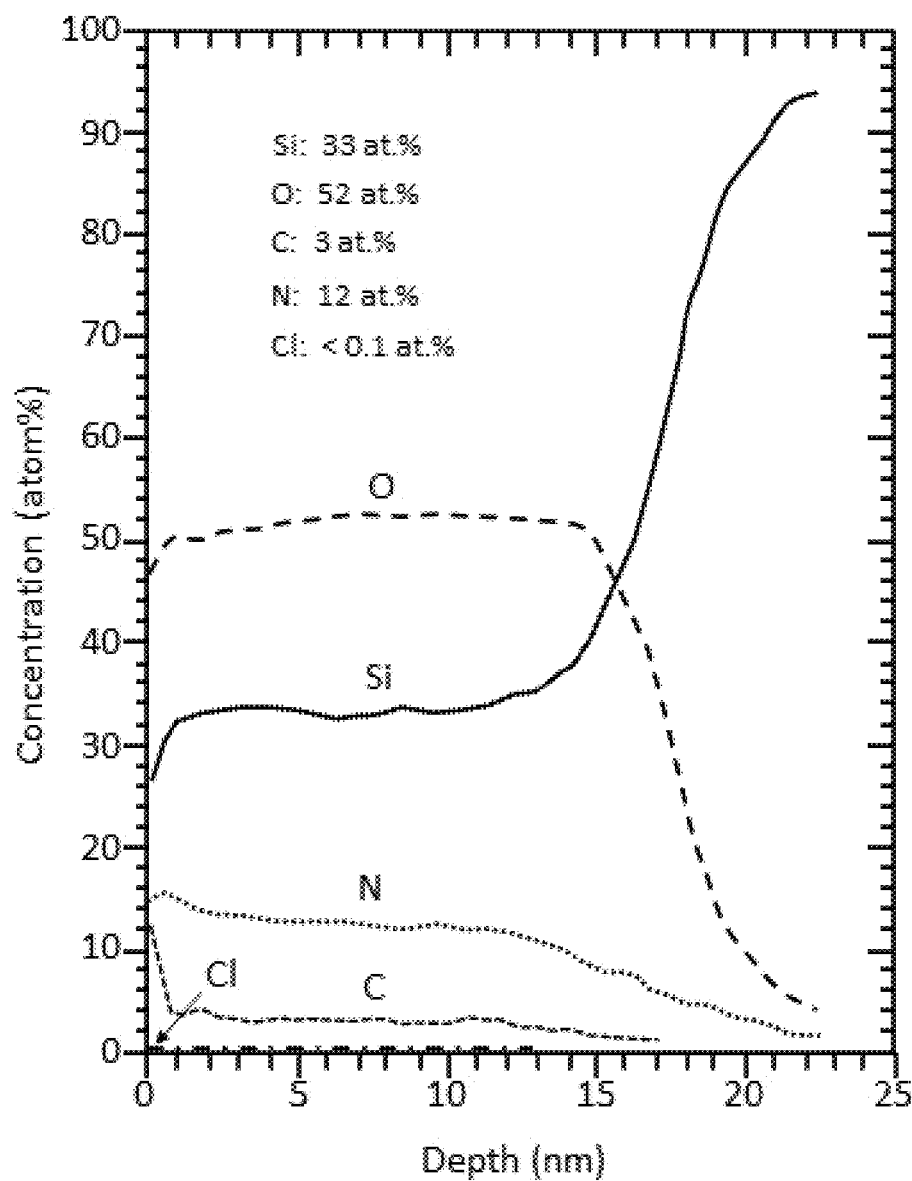

A silicon oxycarbonitride film was deposited with bis(trichlorosilyl)ethane using a method similar to that described in Example 3. SiOCN films were deposited on a silicon coupon with ammonia co-reactant from 450° C. and 515° C. as the coupon temperature, and the reactor pressure was controlled at 2 Torr. The silicon deposition was followed by 16 second ammonia pulse, and the cycle was repeated to give a film thickness of 150-200 Å. Growth rates were found to be 0.3 Å/cycle at 450° C. and 0.23 Å/cycle at 515° C., as shown in FIG. 9. The resulting film compositions are shown in FIG. 10A and FIG. 10B.

Figure 11:
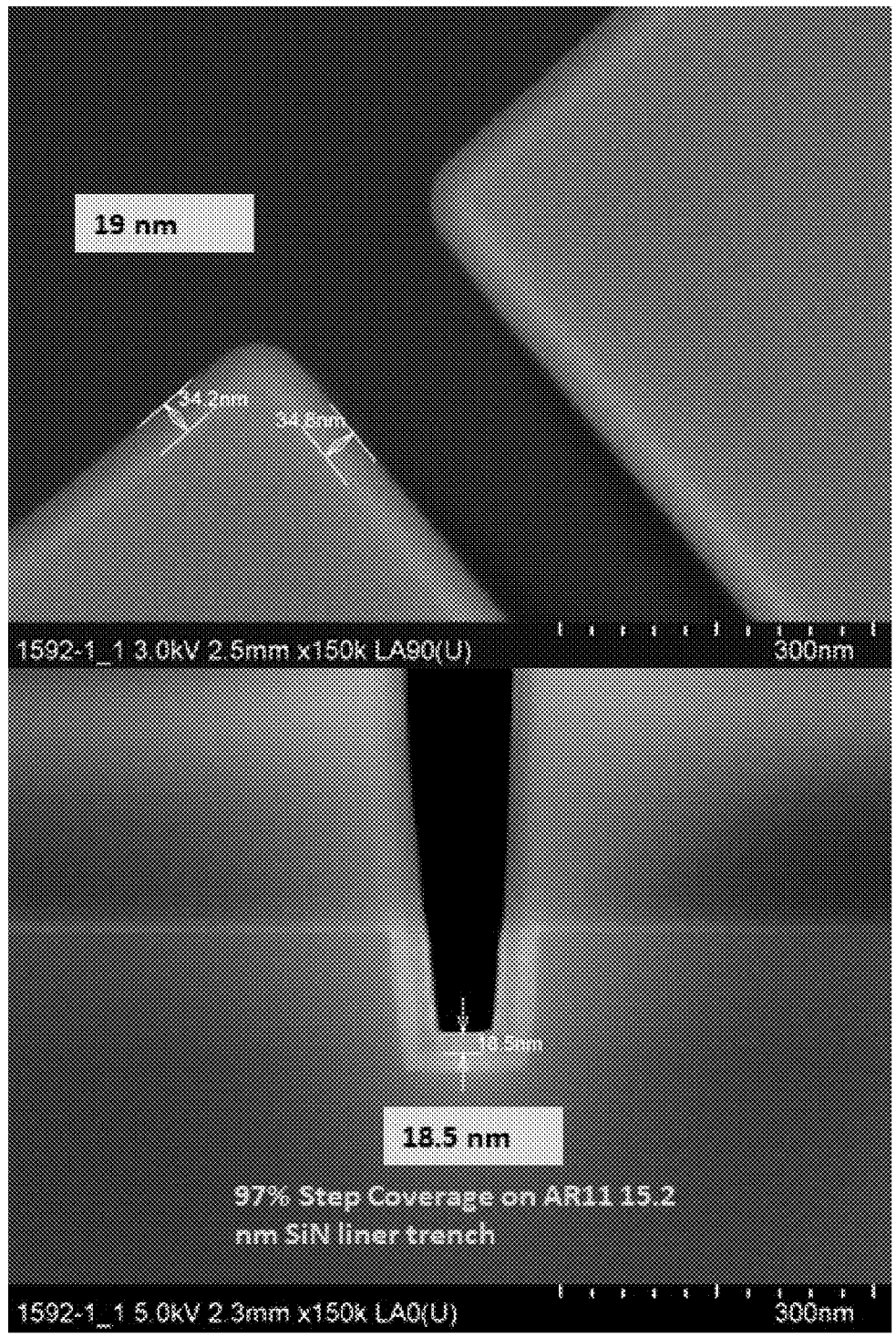

Deposition was also performed on a high aspect ratio structure. High conformality was found using a thermal ALD process with BTCSE, as shown in FIG. 11. Specifically, an 81% conformal silicon-containing film was formed on an AR11 trench structure at 450° C. and a 97% conformal silicon-containing film was formed on an AR11 trench structure at 515° C.

Figure 12A:
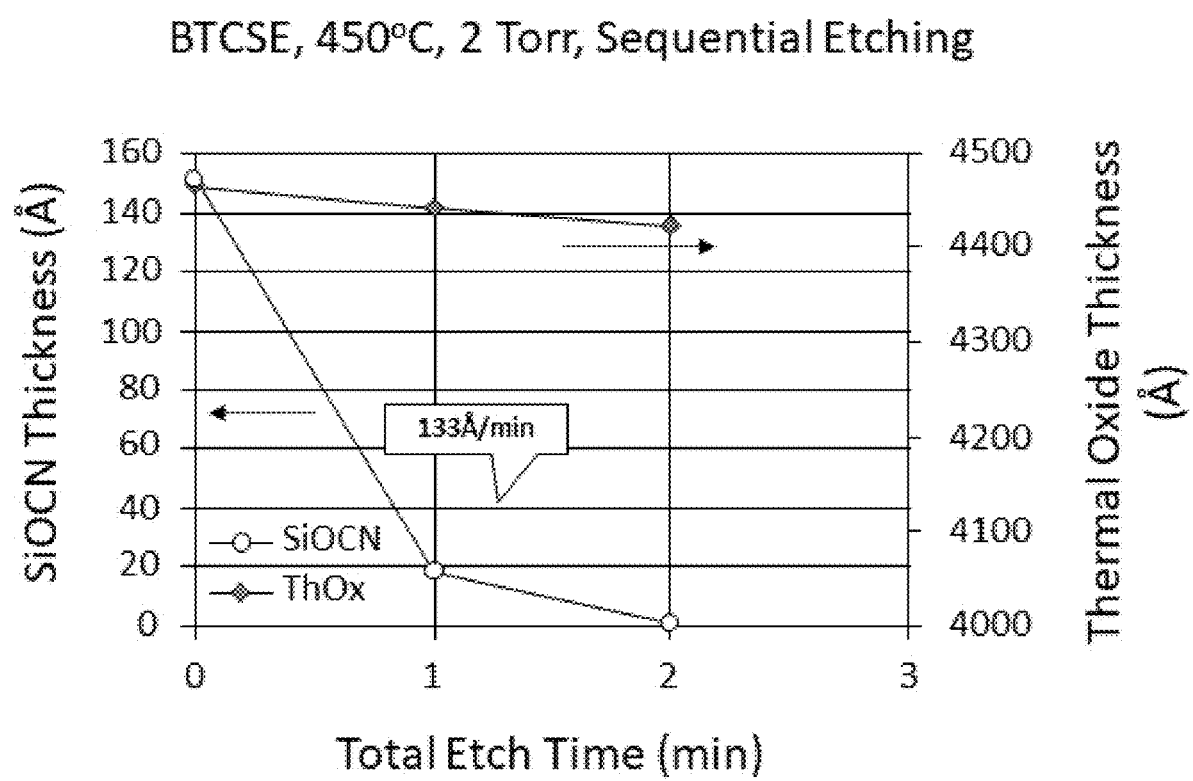
FIGS. 12A and 12B are wet etch rate results (100:1 dilute HF) for these thermal ALD films, using thermal oxide as a comparison. Each of these figures demonstrate that a thermal ALD deposition process with ammonia as a co-reactant can be used to provide highly conformal films at desirable growth rates and having good wet etch performance using an exemplary compound of Formula (I) of the present invention.
Figure 12B:
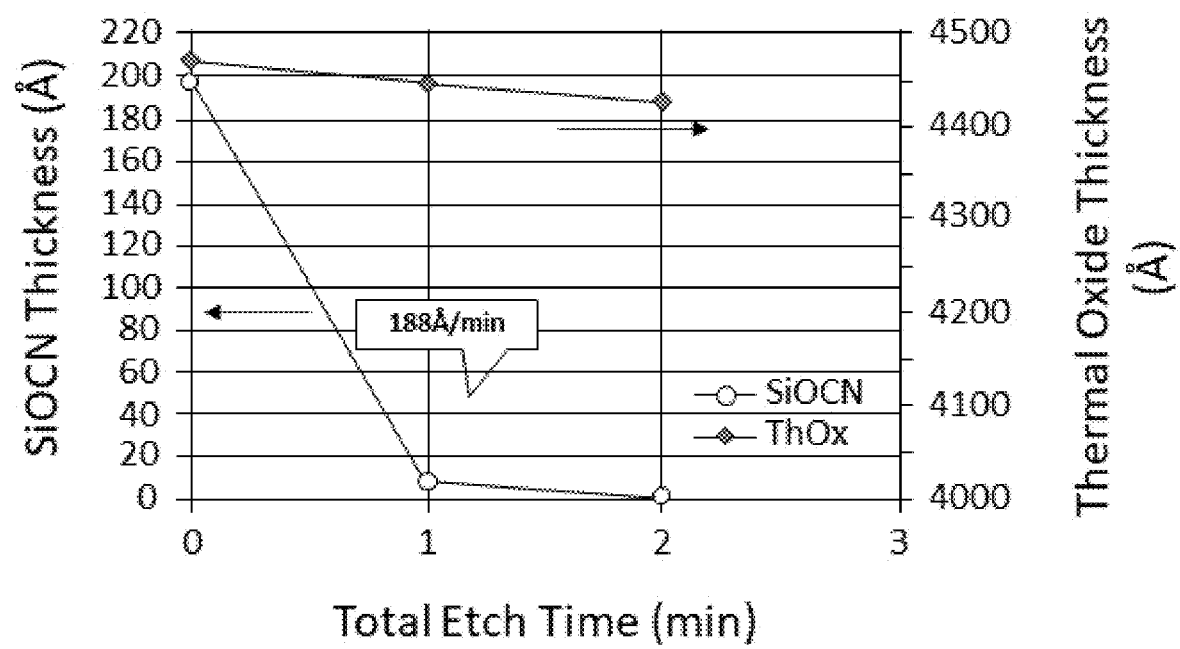

Furthermore, film wet etch rates were obtained using a 0.1% HF diluted solution. As shown in FIG. 12A and FIG. 12B, an etch rate of 133 Å/min resulted for the film formed at 450° C. and an etch rate of 188 Å/min was found for the film formed at 515° C.

The invention has been described in detail with particular reference to certain embodiments thereof, but it will be understood that variations and modifications can be affected within the spirit and scope of the invention.

The invention claimed is:

1. A method for forming a silicon-containing film on the surface of a microelectronic device, which comprises introducing at least one compound of Formula (I):

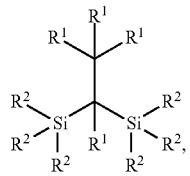
(I)

wherein each $R^1$ is independently chosen from hydrogen or $C_1$-$C_4$ alkyl, and each $R^2$ is independently chosen from chloro, bromo, iodo, hydrogen, or $C_1$-$C_4$ alkyl, provided that no fewer than two of $R^2$ is chosen from chloro, bromo, or iodo, to said surface in a reaction chamber, under atomic layer deposition conditions at a temperature of greater than 600° C., the atomic layer deposition conditions are non-plasma conditions, the silicon-containing film is free of halides, the silicon-containing film is a silicon nitride film with about 9% to about 13% carbon with a silicon to nitrogen ratio of about 1:1, and wherein the compound of Formula (I) has a purity of greater than 98%.

2. The method of claim 1, wherein the atomic layer deposition conditions are at a temperature of greater than 600° C. to about 900° C.

3. The method of claim 1, wherein the atomic layer deposition conditions are at a temperature of about 625° C. to about 725° C.

4. The method of claim 1, wherein the silicon-containing film has a thickness of from about 100 Å to about 1000 Å.

5. The method of claim 1, wherein the silicon-containing film has a thickness of from about 200 Å to about 500 Å.

6. The method of claim 1, wherein the surface is chosen from silicon dioxide, silicon nitride, aluminum oxide, aluminum nitride, aluminum, tungsten, copper, cobalt, molybdenum, ruthenium, a silicon wafer, or combinations thereof.

7. The method of claim 1, wherein the compound of Formula (I) has the formula:

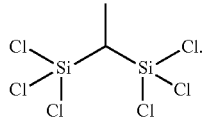

8. A method for forming a silicon-containing film on the surface of a microelectronic device, which comprises introducing at least one compound of Formula (I):

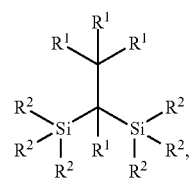
(I)

wherein each $R^1$ is independently chosen from hydrogen or $C_1$-$C_4$ alkyl, and each $R^2$ is independently chosen from chloro, bromo, iodo, hydrogen, or $C_1$-$C_4$ alkyl, provided that no fewer than two of $R^2$ is chosen from chloro, bromo, or iodo, to said surface in a reaction chamber, under thermal atomic layer deposition conditions at a temperature of greater than 400° C., wherein the thermal atomic layer deposition conditions are non-plasma conditions, the silicon-containing film is free of halides, the silicon-containing film is a silicon nitride film with about 9% to about 13% carbon and a silicon to nitrogen ratio of about 1:1, and wherein the compound of Formula (I) has a purity of greater than 98%.

9. The method of claim 8, wherein the silicon-containing film has a thickness of from about 20 Å to about 1000 Å.

10. The method of claim 8, wherein the silicon-containing film has a thickness of from about 100 Å to about 250 Å.

11. The method of claim 8, wherein the compound of Formula (I) has the formula:

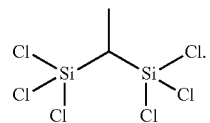

* * * * *